United States Patent
Choi et al.

(10) Patent No.: US 9,672,303 B2
(45) Date of Patent: Jun. 6, 2017

(54) SYSTEM AND METHOD OF PREDICTING INITIAL COOLING OF SUPERCONDUCTING MAGNET

(71) Applicant: KOREA BASIC SCIENCE INSTITUTE, Daejeon (KR)

(72) Inventors: Yeon Suk Choi, Daejeon (KR); Dong Lak Kim, Daejeon (KR)

(73) Assignee: KOREA BASIC SCIENCE INSTITUTE, Daejeon (KR)

( * ) Notice: Subject to any disclaimer, the term of this patent is extended or adjusted under 35 U.S.C. 154(b) by 625 days.

(21) Appl. No.: 13/869,868

(22) Filed: Apr. 24, 2013

(65) Prior Publication Data

US 2014/0180625 A1 Jun. 26, 2014

(30) Foreign Application Priority Data

Dec. 20, 2012 (KR) ........................ 10-2012-0149861

(51) Int. Cl.
*G01K 17/00* (2006.01)
*G01K 1/08* (2006.01)
*G06F 17/50* (2006.01)
*G06F 1/20* (2006.01)
*G01K 7/42* (2006.01)

(52) U.S. Cl.
CPC ......... *G06F 17/5009* (2013.01); *G01K 7/425* (2013.01); *G06F 1/20* (2013.01); *G06F 1/206* (2013.01)

(58) Field of Classification Search
CPC ....... G06F 1/206; G06F 1/20; Y02B 60/1275; G01K 7/425; G05D 23/1917; H01L 23/34; H01L 23/467; H01L 23/4735
USPC .......................... 702/127, 130, 132; 700/300
See application file for complete search history.

(56) References Cited

U.S. PATENT DOCUMENTS 7,167,778 B2 * 1/2007 Yazawa et al. ............... 700/300

FOREIGN PATENT DOCUMENTS

KR 10-2006-0049501 A 5/2006

* cited by examiner

*Primary Examiner* — An Do

(57) ABSTRACT

The present invention provides a system and method of predicting the initial cooling of a superconducting magnet, which can predict the change in initial cooling temperature of a superconducting magnet when the superconducting magnet is cooled using an ultra-low refrigerator. In the system and method, the change in cooling temperature of a superconducting magnet can be accurately predicted by classifying influence factors related to the cooling of a superconducting magnet into a plurality of control volumes and inducing a governing equation with respect to each of the control volumes. Based on this system and method, the reliability of basic data required to design an apparatus for measuring a high magnetic field for forming an ultralow-temperature environment can be greatly improved.

6 Claims, 6 Drawing Sheets

SYSTEM AND METHOD OF PREDICTING INITIAL COOLING OF SUPERCONDUCTING MAGNET

CROSS-REFERENCE TO RELATED APPLICATIONS

This application claims priority to and the benefit of Korean Patent Application No. 10-2012-0149861 filed in the Korean Intellectual Property Office on Dec. 20, 2012, the entire contents of which are incorporated herein by reference.

BACKGROUND OF THE INVENTION

1. Technical Field

The present invention relates to a system and method of predicting the initial cooling of a superconducting magnet, and, more specifically, to a system and method of predicting the initial cooling of a superconducting magnet, which can predict the change in initial cooling temperature of a superconducting magnet when the superconducting magnet is cooled using an ultralow-temperature refrigerator.

Particularly, the present invention relates to an initial cooling prediction system and method of a superconducting magnet, which can accurately predict the change in initial cooling temperature of a superconducting magnet by classifying the factors related to the cooling of the superconducting magnet into a plurality of control volumes and then inducing a governing equation with respect to each control volume.

2. Description of the Related Art

Generally, apparatuses for measuring the magnetic characteristics of an object by applying a high magnetic field to the object under an ultralow-temperature environment act as one of the most important factors in increasing the reliability of measurement results of operation characteristics and magnetic characteristics of a superconducting magnet under an ultralow-temperature environment.

In particular, since a superconducting magnet applying a high magnetic field can obtain high-reliability measurement results only when electric current is supplied thereto at ultra-low temperature, it is important to predict the temperature change of a superconducting magnet according to the cooling of the superconducting magnet at the time that measuring apparatuses are initially started.

Therefore, in the design of ultralow-temperature and high magnetic field measuring apparatuses, the prediction of temperature change of a superconducting magnet during the process of cooling the superconducting magnet from room temperature to ultralow temperature may be an important factor in assuring the reliability of the corresponding measuring apparatuses.

Particularly, to date, most known apparatuses for applying a high magnetic field under an ultralow-temperature environment form an ultralow-temperature environment using liquid helium or liquid nitrogen. However, in apparatuses for forming an ultra-low environment using a refrigerator, methods of predicting the temperature changes of a superconducting magnet during the process of forming an initial ultralow-temperature environment, and of utilizing these temperature changes as design data of measuring apparatuses, are not yet known.

Of course, as technology for predicting and controlling the temperature of a specific object, Korean Patent Registration No. 10-0755166 discloses "an electronic device cooling apparatus, method, system and program for predicting the temperature of an electronic device and cooling the electronic device, and a recording medium for storing the cooling program" (hereinafter, referred to as "prior art").

However, the above prior art is a technology of measuring the heat emitted from various kinds of electronic devices mounted in electronic appliances operating at room temperature to predict the temperature change thereof. This technology is one of the technologies commonly used in daily life, and is a technology for easily using electronic appliances.

Consequently, methods of predicting the initial cooling of a superconducting magnet, which are required to design measuring apparatuses using ultra-low temperature and a high magnetic field, particularly, apparatuses for forming an ultra-low environment using a refrigerator, have never been known.

PRIOR ART DOCUMENT

Patent Document

Korean Patent Registration No. 10-0755166

SUMMARY OF THE INVENTION

Accordingly, the present invention has been devised to solve the above-mentioned problems, and an object of the present invention is to provide a system and method of predicting the cooling of a superconducting magnet, which can accurately predict the temperature change of a superconducting magnet at the time of cooling the superconducting magnet operating under an ultralow-temperature environment.

Particularly, another object of the present invention is to provide a system and method of predicting the cooling of a superconducting magnet, which can accurately predict the temperature change of a superconducting magnet at the time of starting a measuring apparatus to design and fabricate a high-reliability high magnetic field measuring apparatus for forming an ultralow-temperature environment.

In order to accomplish the above objects, an aspect of the present invention provides a method of predicting initial cooling of a superconducting magnet, including the steps of: setting influence factors for predicting initial cooling of a superconducting magnet on the basis of an electronic device including the superconducting magnet and a cooling apparatus for cooling the superconducting magnet; setting at least one control volume on the basis of constituents of each device involved in the cooling of the superconducting magnet; checking the influence factors with respect to each of the control volumes and then inducing a governing equation with respect to each of the control volumes using the checked influence factors; and predicting the initial cooling of the superconducting magnet using the governing equation.

In the step of setting the influence factors, the influence factors may include region factors set by spatially dividing the influence factors, and constituent factors set by dividing constituents influencing the region factors.

The region factors may include: high-temperature region factors influenced by thermal energy transferred from a vacuum container of the cooling apparatus to a radiation shield disposed therein; and low-temperature region factors influenced by thermal energy transferred from the radiation shield to a conduction link provided therein with the superconducting magnet, and the constituent factors may be classified into conduction heat factors and radiation heat factors according to heat transfer mode.

In the step of inducing the governing equation, a mathematical formula with respect to each of the constituent factors may be determined by applying at least one of intrinsic constant values and numbers of each of the constituent factors to a heat transfer formula defined by the heat transfer mode of the constituent factors.

In the step of inducing the governing equation, a mathematical formula with respect to each of the region factors may be determined by the sum of the mathematical formulae of the constituent factors.

In the step of inducing the governing equation, the influence factors may be checked with respect to each of the control volumes, and the governing equation with respect to each of the control volumes may be induced by at least one of sums of mathematical formulae of the region factors and differences therebetween in response to the introduction of the influence factors into the control volumes or the discharge of the influence factors from the control volumes.

In the step of inducing the governing equation, the governing equation with respect to each of the control volumes may be induced by setting at least one of sums of mathematical formulae of the region factors and differences therebetween as a differential equation.

Another aspect of the present invention provides a system for predicting initial cooling of a superconducting magnet, including: an influence factor setting unit for setting influence factors for predicting the initial cooling of a superconducting magnet, the influence factors including region factors and constituent factors, and the constituent factors being classified into conduction heat factors and radiation heat factors according to heat transfer mode; a control volume setting unit for setting at least one control volume on the basis of constituents of each device participating in the cooling of the superconducting magnet; a governing equation inducing unit for checking the influence factors with respect to each of the control volumes and then inducing a governing equation with respect to each of the control volumes using the checked influence factors; and an initial cooling predicting unit for predicting the initial cooling of the superconducting magnet using the governing equation.

The conduction heat factors may include: support factors influenced by thermal energy transferred by a support for fixing and supporting a conduction link including a vacuum container, a radiation shield and a superconducting magnet of the cooling apparatus; and current lead factors influenced by thermal energy transferred by an electric wire connected to the superconducting magnet from the electronic device.

The radiation heat factors may include: vacuum conduction factors influenced by thermal energy transferred from the vacuum container to the superconducting magnet by the radiation shield; and residual gas factors influenced by thermal energy transferred to the superconducting magnet by residual gas in the vacuum container.

BRIEF DESCRIPTION OF THE DRAWINGS

The above and other objects, features and advantages of the present invention will be more clearly understood from the following detailed description taken in conjunction with the accompanying drawings, in which.

Figure 1:
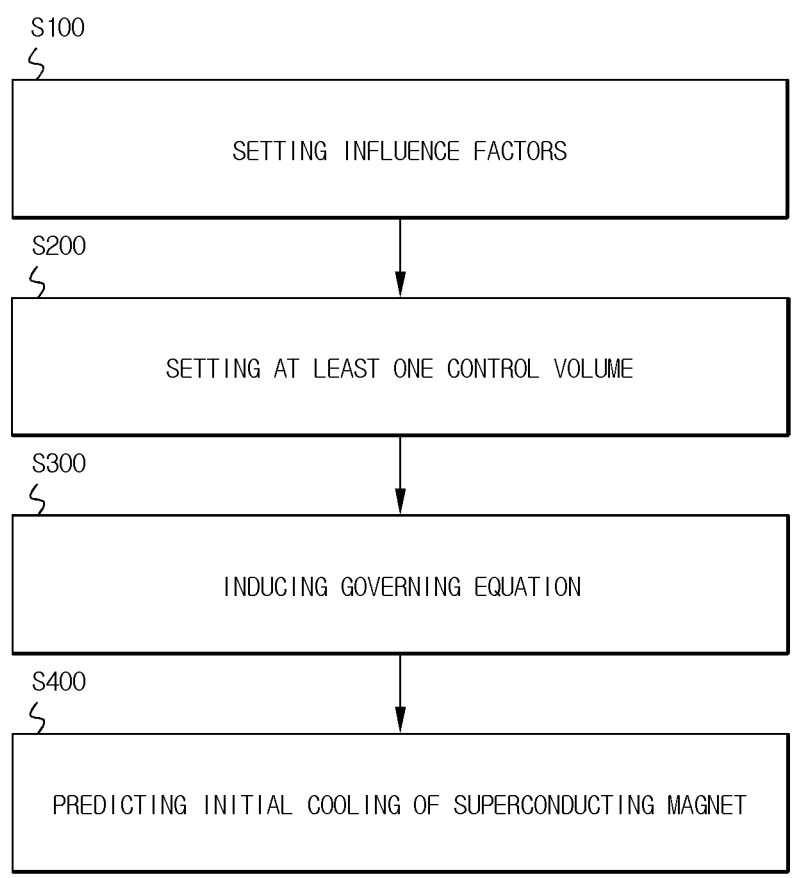
FIG. 1 is a flowchart showing a method of predicting the initial cooling of a superconducting magnet according to the present invention.

REFERENCE NUMERALS 10 influence factor setting unit
11: conduction heat factor setting module
12: radiation heat factor setting module
20: control volume setting unit
30: governing equation inducing unit
40: initial cooling predicting unit
100: ultralow-temperature refrigerator
110: first cooling stage
111: first thermal anchor
120 second cooling stage
121: second thermal anchor
210: vacuum container
220: radiation shield
230: conduction link
240: support
300: superconducting magnet
310: current lead

DESCRIPTION OF THE PREFERRED EMBODIMENTS

Hereinafter, preferred embodiments of the present invention will be described in detail with reference to the attached drawings.

FIG. 1 is a flowchart showing a method of predicting the initial cooling of a superconducting magnet according to the present invention, and FIG. 1 is a block diagram showing a system of predicting the initial cooling of a superconducting magnet according to the present invention.

Figure 2:
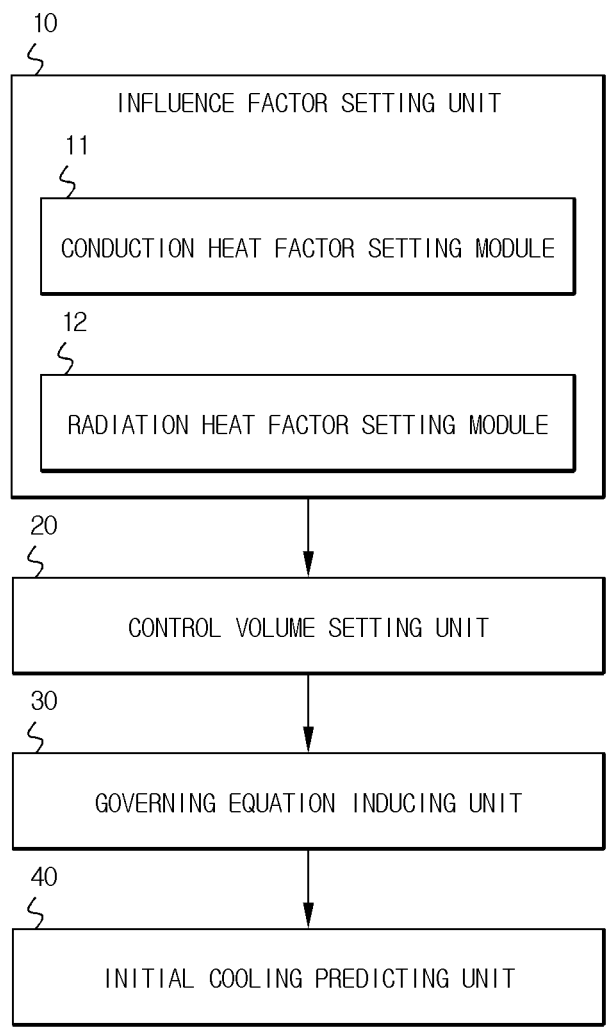
FIG. 2 is a block diagram showing a system of predicting the initial cooling of a superconducting magnet according to the present invention.

Referring to FIGS. 1 and 2, an influence factor setting unit 10 sets influence factors for predicting initial cooling of a superconducting magnet on the basis of an electronic device including the superconducting magnet and a cooling apparatus for cooling the superconducting magnet (S100). Here, the influence factors may include region factors and constituent factors related to the transfer of cool air in the process of supplying cool air from a cooling apparatus to the superconducting magnet.

As shown in FIG. 2, the influence factor setting unit 10 may include a conduction heat factor setting module 11 and a radiation heat factor setting module 12, which are formed by dividing the influence factor setting unit according to heat transfer mode. Each of the conduction heat factor setting module 11 and the radiation heat factor setting module 12 may classify the influence factors into high-temperature region factors and low-temperature region factors. Further, the influence factors may include region factors set by spatially dividing the influence factors and constituent factors set by dividing constituents influencing the region factors. Such influence factors will be described in more detail according to the following embodiments.

Particularly, when a superconducting magnet is cooled in a sealed vacuum container, the influence factors can be simplified into a vacuum container and spaces and constituents formed in the vacuum container.

When the influence factors are set, a control volume setting unit 20 sets at least one control volume on the basis of constituents of each device involved in the cooling of the superconducting magnet (S200). Here, the control volume, which is referred to as a predetermined space region, can be set in order to easily analyze the introduction of thermal energy into the corresponding space and the discharge of thermal energy from this space. In particular, the size and shape of the control volume may be changed by those skilled in the art. Preferably, a solid boundary is set as a part of the control volume, and the other part thereof is set in a direction perpendicular to the movement of thermal energy, thus simplifying the analysis thereof.

When the control volume is set, a governing equation inducing unit 30 checks the influence factors with respect to each of the control volumes, and then induces a governing equation with respect to each of the control volumes using the checked influence factors (S300). Here, the governing equation may be represented by a differential equation such that the temperature change of the superconducting magnet per unit time can be seen in order to accurately predict the temperature change thereof.

Thereafter, an initial cooling predicting unit 40 predicts the initial cooling of the superconducting magnet using the induced governing equation (S400), and the results thereof can be utilized as basic data required to design and fabricate an apparatus for measuring an ultralow temperature and a high magnetic field.

Figure 3:
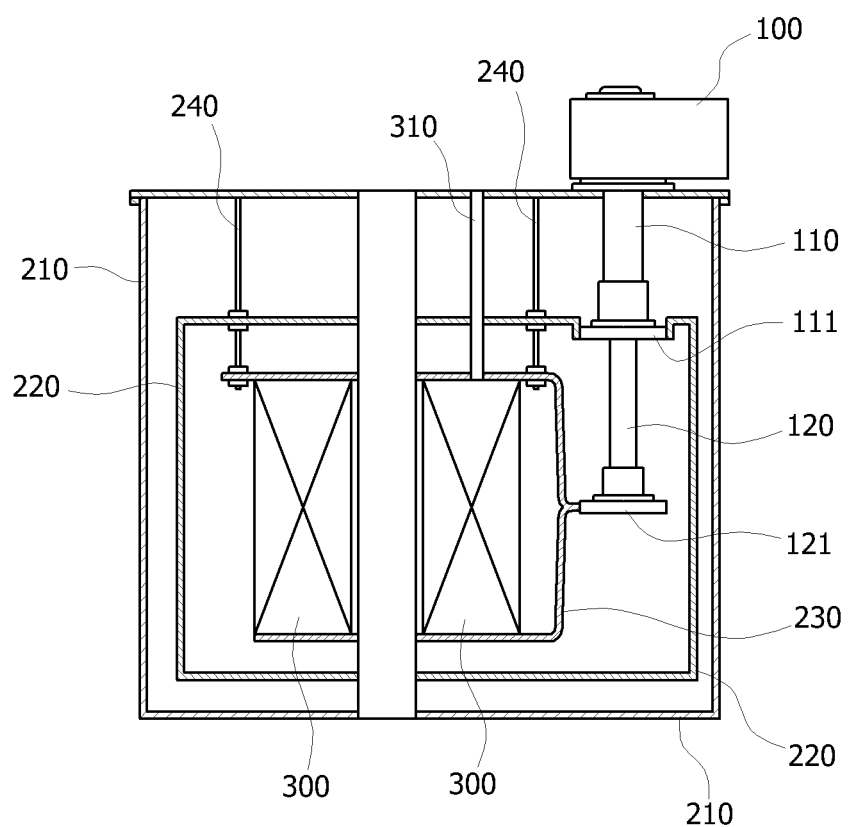
FIG. 3 is a sectional view showing a superconducting magnet cooling apparatus using the method of FIG. 1 according to an embodiment of the present invention.

FIG. 3 is a sectional view showing a superconducting magnet cooling apparatus using the method of FIG. 1 according to an embodiment of the present invention.

Referring to FIG. 3, the superconducting magnet cooling apparatus may include an ultralow-temperature refrigerator 100 for supplying cool air to cool a superconducting magnet 300, and a vacuum container 210 provided therein with the superconducting magnet 300.

Further, the vacuum container 210 may be configured such that a conduction link 230 for fixing a superconducting magnet 300 and a radiation shield 220 for blocking heat and supplying cool air is fixed and installed by a support 240.

The ultralow-temperature refrigerator 100 may include two cooling stages of a first cooling stage 110 and a second cooling stage 120.

The first cooling stage 110 may be connected with the radiation shield 220 by a first thermal anchor 111, and the second cooling stage 120 may be connected with the conduction link 230 by a second thermal anchor 121.

Further, a current lead 310 for supplying an electric current to the superconducting magnet 300 may penetrate the vacuum container 210 and the radiation shield 220 to be connected to the superconducting magnet 300.

Explaining the method of FIG. 1 using the superconducting magnet cooling apparatus of FIG. 3 again, the region factors may include: high-temperature region factors (outer space of the radiation shied) influenced by thermal energy transferred from the vacuum container 210 of the cooling apparatus to the radiation shield 220 disposed therein; and low-temperature region factors (inner space of the radiation shield) influenced by thermal energy transferred from the radiation shield 220 to the conduction link 230 provided therein with the superconducting magnet 300.

Further, the constituent factors may be classified into conduction heat factors and radiation heat factors according to heat transfer mode.

The conduction heat factors may include: support factors influenced by thermal energy transferred by a support 240; and current lead factors influenced by thermal energy transferred by an electric wire 310 connected to the superconducting magnet 300 from an electronic device (not shown).

The radiation heat factors may include: vacuum conduction factors influenced by thermal energy transferred from the vacuum container 210 to the superconducting magnet 300 by the radiation shield 220; and residual gas factors influenced by thermal energy transferred to the superconducting magnet 300 by residual gas in the vacuum container 210.

Hereinafter, the process of inducing a governing equation for predicting the initial cooling of a superconducting magnet will be described with reference to FIGS. 4 and 5.

Figure 4:
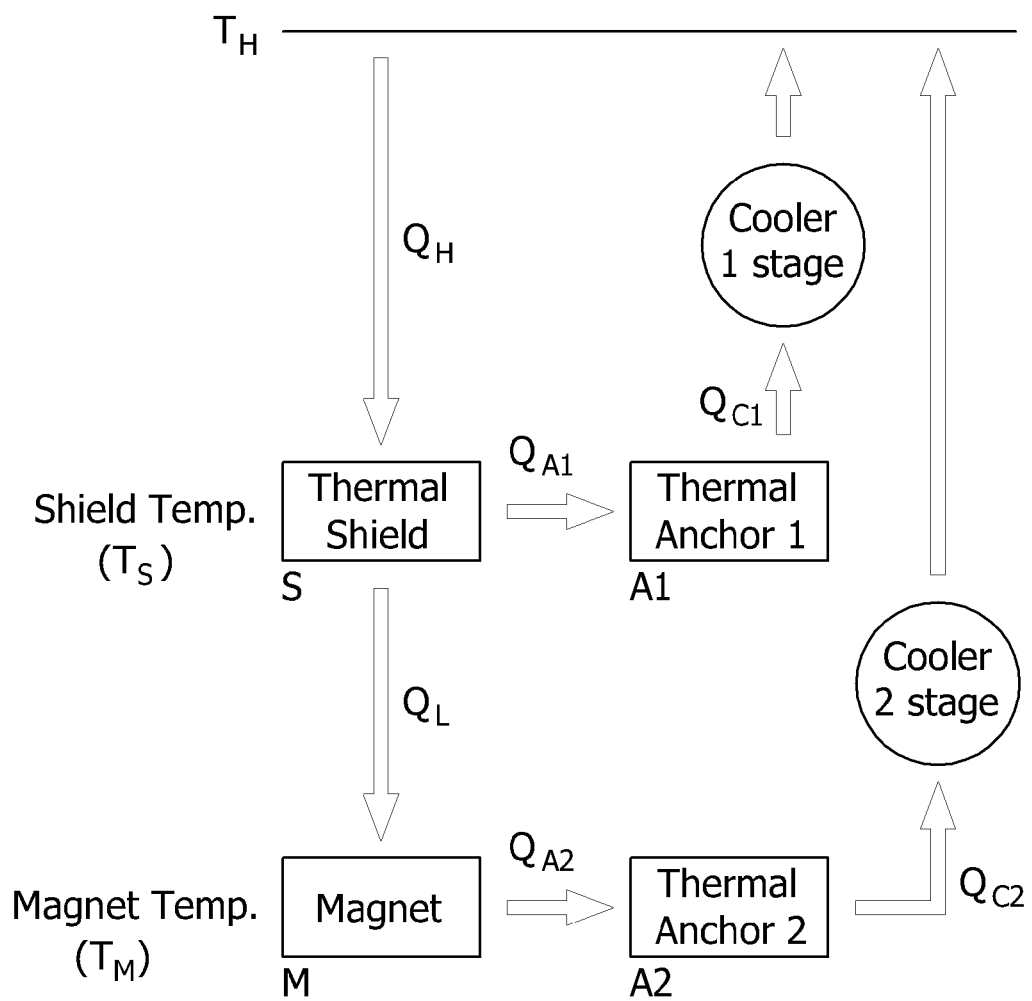
FIG. 4 is a schematic view explaining the movement of thermal energy in the superconducting magnet cooling apparatus divided into four control volumes of FIG. 3.
Figure 5:
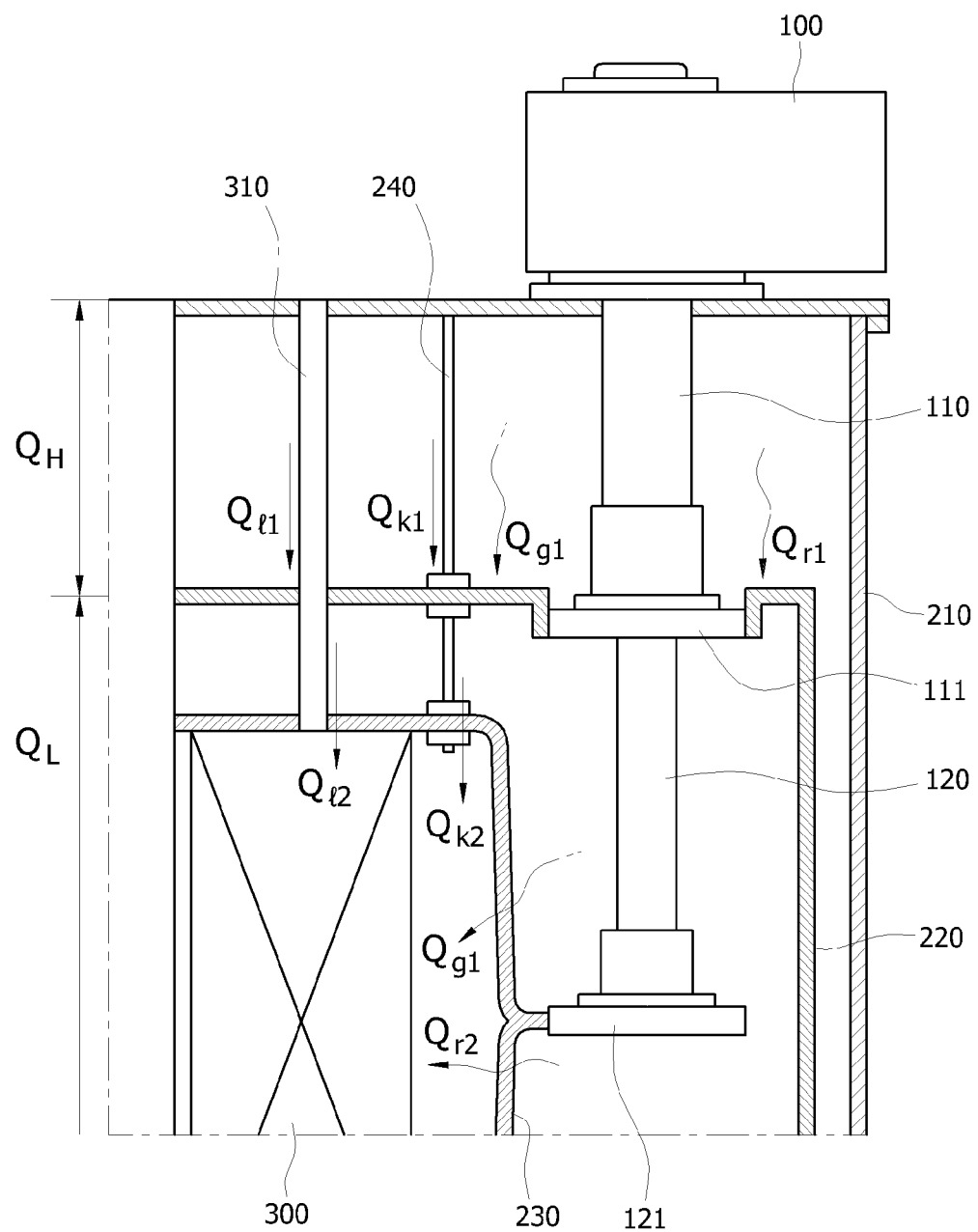
FIG. 5 is a sectional view explaining the influence factors constituting the governing equation of the superconducting magnet cooling apparatus of FIG. 3.

FIG. 4 is a schematic view explaining the movement of thermal energy in the superconducting magnet cooling apparatus divided into four control volumes of FIG. 3, and FIG. 5 is a sectional view explaining the influence factors constituting the governing equation of the superconducting magnet cooling apparatus of FIG. 3.

First, as shown in FIG. 4, the control volumes may be set as a thermal shield region (radiation shield), a magnet region (superconducting magnet) and two thermal anchor regions for supplying cool air. Here, the governing equation with respect to each of the regions is defined by a differential equation, by which temperature change per unit time can be indicated, based on the directions of inflow and outflow of thermal energy shown in FIG. 4.

First, the temperature change per unit time in the thermal shield region is represented by Mathematical Formula 1 below:

$$\frac{dE_s}{dt} = Q_H - Q_{A1} - Q_L = \frac{d}{dt}(\rho V C_p T)_S \quad \text{(Mathematical Formula 1)}$$

Here, the subscript "S" means radiation shield, $Q_H$ is the amount of thermal energy externally flowing into the radiation shield, $Q_{A1}$ is the amount of thermal energy transferred from the radiation shield to the first thermal anchor, $Q_L$ is the amount of thermal energy transferred from the radiation shield to the superconducting magnet, $\rho$ is density, V is volume, $C_P$ is thermal capacity, and T is absolute temperature.

Further, the temperature change per unit time in the first thermal anchor region is represented by Mathematical Formula 2 below:

$$\frac{dE_{A1}}{dt} = Q_{A1} - Q_{C1} = \frac{d}{dt}(\rho V C_P T)_{A1} \quad \text{(Mathematical Formula 2)}$$

Here, the subscript "A1" means the first thermal anchor, and $Q_{C1}$ is the amount of thermal energy discharged to the ultralow-temperature refrigerator after being heat-exchanged in the first thermal anchor.

Further, the temperature change per unit time in the magnet region is represented by Mathematical Formula 3 below:

$$\frac{dE_M}{dt} = Q_L - Q_{A2} = \frac{d}{dt}(\rho V C_P T)_M \quad \text{(Formula 3)}$$

Here, the subscript "M" means the magnet (superconducting magnet, and $Q_{A2}$ is the amount of thermal energy transferred from the superconducting magnet to the second thermal anchor.

Finally, the temperature change per unit time in the second thermal anchor region is represented by Mathematical Formula 4 below:

$$\frac{dE_{A2}}{dt} = Q_{A2} - Q_{C2} = \frac{d}{dt}(\rho V C_P T)_{A2} \qquad \text{(Mathematical Formula 4)}$$

Here, the subscript "A2" means the second thermal anchor, and $Q_{C2}$ is the amount of thermal energy discharged to the ultralow-temperature refrigerator after being heat-exchanged in the second thermal anchor.

The thermal energy (Q) represented by Mathematical Formulae 1 to 4 above will be described in more detail as follows.

$Q_H$ is the total amount of thermal energy transferred from the outside to the radiation shield, and is represented by Mathematical Formula 5 below:

$$Q_H = Q_{k1} + Q_{r1} + Q_{l1} + Q_{g1} \qquad \text{(Mathematical Formula 5)}$$

Here, $Q_{k1}$ is the amount of conduction thermal energy transferred from the outside to the radiation shield through the support, $Q_{r1}$ is the amount of radiation thermal energy transferred from the outside to the radiation shield, $Q_{l1}$ is the amount of conduction thermal energy transferred from the outside to the radiation shield through the current lead, and $Q_{g1}$ is the amount of radiation thermal energy transferred to the radiation shield by residual gas existing between the vacuum container and the radiation shield.

$Q_L$ is the total amount of thermal energy transferred from the radiation shield to the superconducting magnet, and is represented by Mathematical Formula 6 below:

$$Q_L = Q_{k2} + Q_{r2} + Q_{l2} + Q_{g2} \qquad \text{(Mathematical Formula 6)}$$

Here, $Q_{k2}$ is the amount of conduction thermal energy transferred from the radiation shield to the superconducting magnet through the support, $Q_{r2}$ is the amount of radiation thermal energy transferred from the radiation shield to the superconducting magnet, $Q_{l2}$ is the amount of conduction thermal energy transferred from the radiation shield to the superconducting magnet through the current lead, and $Q_{g2}$ is the amount of radiation thermal energy transferred to the superconducting magnet by residual gas existing in the radiation shield.

Each of $Q_{k1}$ of Mathematical Formula 5 and $Q_{k2}$ of Mathematical Formula 6 is represented by Mathematical Formula 7 below:

$$Q_k = N \cdot \frac{A}{L} \int_{T_L}^{T_H} k(T) dT \qquad \text{(Mathematical Formula 7)}$$

Here, N is the number of supports, A is the section area of the support, L is the length of the support, k is the thermal conductivity of the support, $T_H$ is the temperature of a hot portion, $T_L$ is the temperature of a cold portion, and the subscripts "1 and 2" are respectively the outside and inside of the radiation shield.

Each of $Q_{r1}$ of Mathematical Formula 5 and $Q_{r2}$ of Mathematical Formula 6 is represented by Mathematical Formula 8 below:

$$Q_r = \frac{\gamma(T_H^4 - T_L^4)}{\frac{1-\varepsilon_H}{\varepsilon_H A_H} + \frac{1}{A_L}\left(\frac{1}{\varepsilon_L} + \frac{2N}{\varepsilon_N} - N\right)} \qquad \text{(Mathematical Formula 8)}$$

Here, $\sigma$ is Boltzmann constant, $\epsilon$ is the emissivity of the radiation shield, A is the surface area of the radiation shield, N is the number of radiation shields (number of layers), the subscript "H" is a high-temperature region, and the subscript "L" is a low-temperature region.

Each of $Q_{l1}$ of Mathematical Formula 5 and $Q_{l2}$ of Mathematical Formula 6 is represented by Mathematical Formula 9 below:

$$Q_l = 2 \cdot \frac{A}{L} \int_{T_L}^{T_H} k(T) dT \qquad \text{(Mathematical Formula 9)}$$

Here, A is the section area of the current lead, L is the length of the current lead, k is the thermal conductivity of the current lead, and the constant "2" of Mathematical Formula 9 means that the number of current leads is 2.

Each of $Q_{g1}$ of Mathematical Formula 5 and $Q_{g2}$ of Mathematical Formula 6 is represented by Mathematical Formula 10 below:

$$Q_g = \frac{a_0 PA}{4} \frac{\gamma+1}{\gamma-1} \sqrt{\frac{2R}{\pi M}} \frac{T_H - T_L}{\sqrt{T}} \qquad \text{(Mathematical Formula 10)}$$

Here, P is a pressure of residual gas, A is a radiation area, $\tau$ is a thermal expansion coefficient of residual gas, R is a thermal constant of residual gas, and M is a molecular weight of residual gas.

$a_0$ of Mathematical Formula 10 is represented by Mathematical Formula 11 below:

$$a_0 = \frac{a_1 a_2}{a_2 + (A_2/A_1)(1 - a_2)a_1} \qquad \text{(Mathematical Formula 11)}$$

Here, $A_1$ and $A_2$ are respectively the inflow area and outflow area of thermal energy transferred by residual gas, and $a_1$ and $a_2$ are the accommodation coefficients of residual gas to $A_1$ and $A_2$.

If $A_1$ and $A_2$ are equal to or similar to each other, $a_0$ is represented by Mathematical Formula 12 below:

$$a_0 = \frac{a_1 a_2}{a_1 + a_2 - a_1 a_2} \qquad \text{(Mathematical Formula 12)}$$

Further, if $a_1$ and $a_2$ are equal to each other by a, $a_0$ is represented by Mathematical Formula 13 below:

$$a_0 = \frac{a}{2-a} \qquad \text{(Mathematical Formula 13)}$$
$$= \frac{1}{2}a, \text{ for } a \to 0$$
$$= a, \text{ for } a \to 1$$

The temperature change of the superconducting magnet cooled from room temperature to ultralow temperature can be accurately predicted by the governing equation induced as above.

Figure 6:
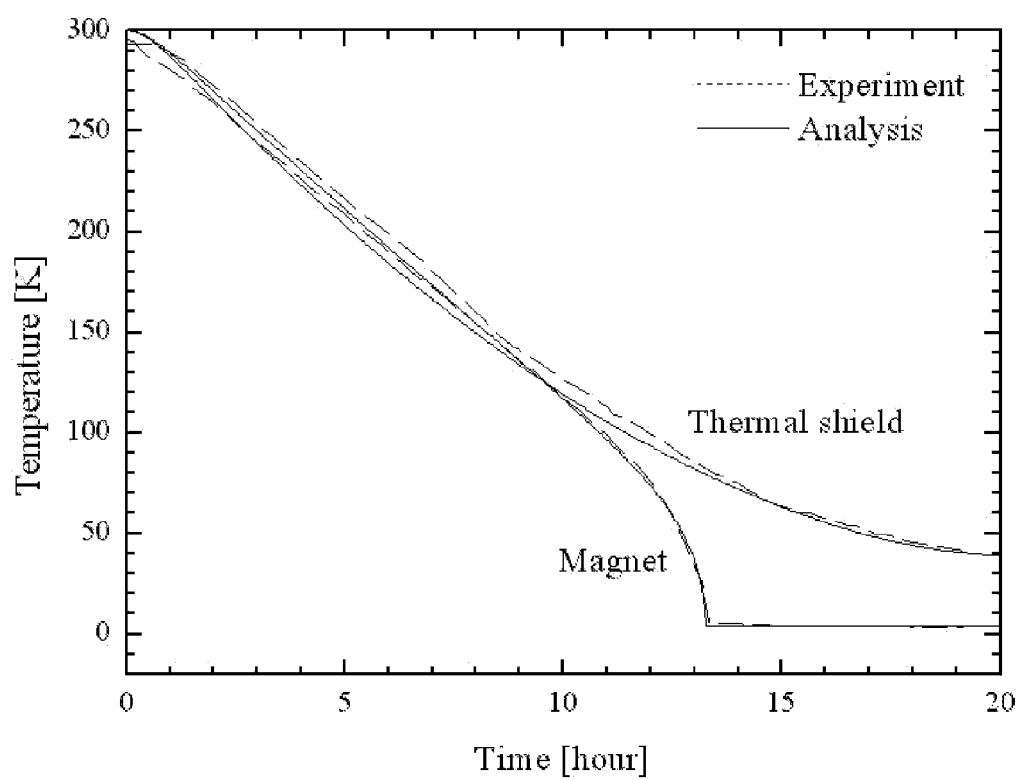
FIG. 6 is a graph comparing analysis data and experimental data predicted by applying the method of FIG. 1 to the superconducting magnet cooling apparatus of FIG. 3.

FIG. 6 is a graph comparing analysis data and experimental data predicted by applying the method of FIG. 1 to the superconducting magnet cooling apparatus of FIG. 3.

Referring to FIG. 6, it can be seen that the temperature change predicted by the governing equation induced according to the present invention is very similar to the temperature change really measured.

Therefore, the method of predicting the initial cooling of a superconducting magnet according to the present invention can provide very reliable prediction data.

The system and method of predicting the initial cooling of a superconducting magnet according to the present invention have been described as above. However, it can be understood that the technical configuration of present invention can be modified into other specific embodiments by those skilled in the art without changing the technical idea and features of the present invention.

As described above, the present invention is advantageous in that the change in initial cooling temperature of a superconducting magnet can be accurately predicted when the superconducting magnet is cooled using an ultralow-temperature refrigerator.

Based on this advantage, the present invention is effective at improving the reliability of basic data required to design an apparatus for measuring a high magnetic field for forming an ultralow-temperature environment.

Consequently, the present invention is effective in that it is possible to design and fabricate an apparatus for measuring an ultralow temperature and a high magnetic field, which can obtain more accurate measuring results using the results of predicting the initial cooling of a superconducting magnet.

Therefore, according to the present invention, reliability and competitiveness can be improved in the fields of ultralow-temperature and high magnetic field measuring apparatuses, particularly, in the field of measuring apparatus design and related and similar fields thereto.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of predicting initial cooling of a superconducting magnet, comprising the steps of:
   setting influence factors for predicting initial cooling of a superconducting magnet on the basis of an electronic device including the superconducting magnet and a cooling apparatus for cooling the superconducting magnet;
   setting at least one control volume on the basis of constituents of each device involved in the cooling of the superconducting magnet;
   checking the influence factors with respect to each of the control volumes and then inducing governing equations with respect to a thermal shield region, a first thermal anchor region, a magnet region, a second thermal anchor region, a radiation shield and a superconducting magnet using the checked influence factors; and
   predicting the initial cooling of the superconducting magnet using the governing equations, wherein the influence factors may include region factors set by spatially dividing the influence factors, and constituent factors set by dividing constituents influencing the region factors,
   wherein the region factors include: high-temperature region factors influenced by thermal energy transferred from a vacuum container of the cooling apparatus to a radiation shield disposed therein; and low-temperature region factors influenced by thermal energy transferred from the radiation shield to a conduction link provided therein with the superconducting magnet, and the constituent factors are classified into conduction heat factors and radiation heat factors according to heat transfer mode,
   wherein the governing equations are:
   temperature change per unit time in the thermal shield region is represented by $$\frac{dE_s}{dt} = Q_H - Q_{A1} - Q_L = \frac{d}{dt}(\rho V C_p T)_s$$

[superscript S means radiation shield,
   $Q_H$ is an amount of thermal energy externally flowing into the radiation shield,
   $Q_{A1}$ is amount of thermal energy transferred from the radiation shield to the first thermal anchor,
   $Q_L$ is amount of thermal energy transferred from the radiation shield to the superconducting magnet,
   $\rho$ is density,
   V is volume,
   $C_P$ is thermal capacity,
   T is absolute temperature],
   temperature change per unit time in the first thermal anchor region is represented by $$\frac{dE_{A1}}{dt} = Q_{A1} - Q_{C1} = \frac{d}{dt}(\rho V C_p T)_{A1}$$

[subscript A1 means the first thermal anchor,
   $Q_{C1}$ is amount of thermal energy discharged to the ultralow-temperature refrigerator after being heat-exchanged in the first thermal anchor],
   temperature change per unit in time in the magnet region is represented by $$\frac{dE_M}{dt} = Q_L - Q_{A2} = \frac{d}{dt}(\rho V C_p T)_M$$

[subscript M means superconducting magnet,
   $Q_{A2}$ is amount of thermal energy transferred from the superconducting magnet to a second thermal anchor],
   temperature change per unit in time in the second thermal anchor region is represented by $$\frac{dE_{A2}}{dt} = Q_{A2} - Q_{C2} = \frac{d}{dt}(\rho V C_p T)_{A2}$$

[subscript A2 means second thermal anchor,
   $Q_{C2}$ is amount of thermal energy transferred from the superconducting magnet to the second thermal anchor], total amount of thermal energy transferred from the outside to the radiation shield ($Q_H$) is represented by $$Q_H = Q_{k1} + Q_{r1} + Q_{l1} + Q_{g1}$$

[$Q_{k1}$ is amount of conduction thermal energy transferred from the outside to the radiation shield through the support,
$Q_{r1}$ is amount of radiation thermal energy transferred from the outside to the radiation shield,
$Q_{l1}$ is amount of conduction thermal energy transferred from the outside to the radiation shield through current lead,
$Q_{g1}$ is amount of radiation thermal energy transferred to the radiation shield by residual gas existing between the vacuum container and the radiation shield],
total amount of thermal energy transferred from the radiation shield to the superconducting magnet($Q_L$) is represented by:

$$Q_L = Q_{k2} + Q_{r2} + Q_{l2} + Q_{g2}$$

[$Q_{k2}$ is amount of conduction thermal energy transferred from the radiation shield to the superconducting magnet through the support,
$Q_{r2}$ is amount of radiation thermal energy transferred from the radiation shield to the superconducting magnet,
$Q_{l2}$ is amount of conduction thermal energy transferred from the radiation shield to the superconducting magnet through the current lead,
$Q_{g2}$ is amount of radiation thermal energy transferred to the superconducting magnet by residual gas existing in the radiation shield,]
$Q_{k1}$ and $Q_{k2}$ are represented by $$Q_k = N \cdot \frac{A}{L} \int_{T_L}^{T_H} k(T) dT$$

[N is number of supports,
A is section area of the support,
L is length of the support,
k is thermal conductivity of the support,
$T_H$ is temperature of a hot portion,
$T_L$ is temperature of a cold portion,
the subscripts '1' and '2' are respectively the outside and inside of the radiation shield,]
$Q_{r1}$ and $Q_{r2}$ are represented by $$Q_r = \frac{\gamma(T_H^4 - T_L^4)}{\frac{1-\varepsilon_H}{\varepsilon_H A_H} + \frac{1}{A_L}\left(\frac{1}{\varepsilon_L} + \frac{2N}{\varepsilon N} - N\right)}$$

[$\varepsilon$ is the emissivity of the radiation shield,
A is the surface area of the radiation shield,
N is number of radiation shields (number of layers),
the subscript 'H' is a high-temperature region,
the subscript 'L' is a low-temperature region,
the subscripts '1' and '2' are respectively the outside and inside of the radiation shield,]
$Q_{l1}$ and $Q_{l2}$ are represented by $$Q_l = 2 \cdot \frac{A}{L} \int_{T_L}^{T_H} k(T) dT$$

[A is section area of the current lead,
L is length of the current lead,
k is thermal conductivity of the current lead]
$Q_{g1}$ and $Q_{g2}$ are represented by $$Q_g = \frac{a_0 PA}{4} \frac{\gamma+1}{\gamma-1} \sqrt{\frac{2R}{\pi M}} \frac{T_H - T_L}{\sqrt{T}}$$

[P is a pressure of residual gas,
A is a radiation area,
$\tau$ is a thermal expansion coefficient of residual gas,
R is a thermal constant of residual gas,
M is a molecular weight of residual gas]
$a_0$ is represented by $$a_0 = \frac{a_1 a_2}{a_2 + (A_2/A_1)(1-a_2)a_1}$$

[$A_1$ and $A_2$ are respectively inflow area and outflow area of thermal energy transferred by residual gas,
$a_1$ and $a_2$ are accommodation coefficients of residual gas to $A_1$ and $A_2$].

2. The method of claim 1, wherein, in the step of inducing the governing equations, a mathematical formula with respect to each of the constituent factors is determined by applying at least one of intrinsic constant values and numbers of each of the constituent factors to a heat transfer formula defined by the heat transfer mode of the constituent factors.

3. The method of claim 2, wherein, in the step of inducing the governing equations, a mathematical formula with respect to each of the region factors is determined by the sum of the mathematical formulae of the constituent factors.

4. The method of claim 3, wherein, in the step of inducing the governing equations, the influence factors are checked with respect to each of the control volumes, and the governing equation with respect to each of the control volumes is induced by at least one of sums of mathematical formulae of the region factors and differences therebetween in response to the introduction of the influence factors into the control volumes or the discharge of the influence factors from the control volumes.

5. The method of claim 4, wherein, in the step of inducing the governing equations, each of the governing equations with respect to each of the control volumes is induced by setting at least one of sums of mathematical formulae of the region factors and differences therebetween as a differential equation.

6. An apparatus for predicting initial cooling of a superconducting magnet, comprising:
an influence factor setting unit for setting influence factors for predicting the initial cooling of a superconducting magnet, the influence factors including region factors and constituent factors, and the constituent factors being classified into conduction heat factors and radiation heat factors according to heat transfer mode;
a control volume setting unit for setting at least one control volume on the basis of constituents of each device participating in the cooling of the superconducting magnet;
a governing equation inducing unit for checking the influence factors with respect to each of the control volumes and then inducing governing equations with respect to a thermal shield region, a first thermal anchor region, a magnet region, a second thermal anchor region, a radiation shield and a superconducting magnet using the checked influence factors; and an initial cooling predicting unit for predicting the initial cooling of the superconducting magnet using the governing equations, wherein the conduction heat factors include: support factors influenced by thermal energy transferred by a support for fixing and supporting a conduction link including a vacuum container, a radiation shield and a superconducting magnet of the cooling apparatus; and current lead factors influenced by thermal energy transferred by an electric wire connected to the superconducting magnet from the electronic device, and wherein the radiation heat factors include: vacuum conduction factors influenced by thermal energy transferred from the vacuum container to the superconducting magnet by the radiation shield; and the residual gas factors influenced by thermal energy transferred to the superconducting magnet by residual gas in the vacuum container, wherein the influence factors may include region factors set by spatially dividing the influence factors, and constituent factors set by dividing constituents influencing the region factors, wherein the region factors include: high-temperature region factors influenced by thermal energy transferred from a vacuum container of the cooling apparatus to a radiation shield disposed therein; and low-temperature region factors influenced by thermal energy transferred from the radiation shield to a conduction link provided therein with the superconducting magnet, and the constituent factors are classified into conduction heat factors and radiation heat factors according to heat transfer mode, wherein the governing equations are:

temperature change per unit time in the thermal shield region is requested by $$\frac{dE_s}{dt} = Q_H - Q_{A1} - Q_L = \frac{d}{dt}(\rho V C_p T)_S$$

[superscript S means radiation shield,
$Q_H$ is an amount of thermal energy externally flowing into the radiation shield,
$Q_{A1}$ is amount of thermal energy transferred from the radiation shield to the first thermal anchor,
$Q_L$ is amount of thermal energy transferred from the radiation shield to the superconducting magnet,
$\rho$ is density,
V is volume,
$C_P$ is thermal capacity,
T is absolute temperature], temperature change per unit time in the first thermal anchor region is represented by $$\frac{dE_{A1}}{dt} = Q_{A1} - Q_{C1} = \frac{d}{dt}(\rho V C_p T)_{A1}$$

[subscript A1 means the first thermal anchor,
$Q_{C1}$ is amount of thermal energy discharged to the ultralow-temperature refrigerator after being heat-exchanged in the first thermal anchor], temperature change per unit in time in the magnet region is represented by $$\frac{dE_M}{dt} = Q_L - Q_{A2} = \frac{d}{dt}(\rho V C_p T)_M$$

[subscript M means superconducting magnet,
$Q_{A2}$ is amount of thermal energy transferred from the superconducting magnet to a second thermal anchor], temperature change per unit in time in the second thermal anchor region is represented by $$\frac{dE_{A2}}{dt} = Q_{A2} - Q_{C2} = \frac{d}{dt}(\rho V C_p T)_{A2}$$

[subscript A2 means second thermal anchor,
$Q_{C2}$ is amount of thermal energy transferred from the superconducting magnet to the second thermal anchor], total amount of thermal energy transferred from the outside to the radiation shield ($Q_H$) is represented by $Q_H = Q_{k1} + Q_{r1} + Q_{l1} + Q_{g1}$

[$Q_{k1}$ is amount of conduction thermal energy transferred from the outside to the radiation shield through the support,
$Q_{r1}$ is amount of radiation thermal energy transferred from the outside of the radiation shield,
$Q_{l1}$ is amount of conduction thermal energy transferred from the outside to the radiation shield through current lead,
$Q_{g1}$ is amount of radiation thermal energy transferred to the radiation shield by residual gas existing between the vacuum container and the radiation shield], total amount of thermal energy transferred from the radiation shield to the superconducting magnet ($Q_L$) is represented by:

$Q_L = Q_{k2} + Q_{r2} + Q_{l2} + Q_{g2}$

[$Q_{k2}$ is amount of conduction thermal energy transferred from the radiation shield to the superconducting magnet through the support,
$Q_{r2}$ is amount of radiation thermal energy transferred from the radiation shield to the superconducting magnet,
$Q_{l2}$ is amount of conduction thermal energy transferred from the radiation shield to the superconducting magnet through the current lead,
$Q_{g2}$ is amount of radiation thermal energy transferred to the superconducting magnet by residual gas existing in the radiation shield], $Q_{k1}$ and $Q_{k2}$ are represented by $$Q_k = N \cdot \frac{A}{L} \int_{T_L}^{T_H} k(T) dT$$

[N is number of supports,
A is section area of the support,
L is length of the support,
k is thermal conductivity of the support,
$T_H$ is temperature of a hot portion,
$T_L$ is temperature of a cold portion, the subscripts '1' and '2' are respectively the outside and inside of the radiation shield,]
$Q_{r1}$ and $Q_{r2}$ are represented by $$Q_r = \frac{\gamma(T_H^4 - T_L^4)}{\frac{1-\varepsilon_H}{\varepsilon_H A_H} + \frac{1}{A_L}\left(\frac{1}{\varepsilon_L} + \frac{2N}{\varepsilon N} - N\right)}$$

[ϵ is the emissivity of the radiation shield,
A is the surface area of the radiation shield,
N is number of radiation shields (number of layers),
the subscript 'H' is a high-temperature region,
the subscript 'L' is a low-temperature region,
the subscripts '1' and '2' are respectively the outside and inside of the radiation shield,]
$Q_{l1}$ and $Q_{l2}$ are represented by $$Q_l = 2 \cdot \frac{A}{L} \int_{T_L}^{T_H} k(T) dT$$

[A is section area of the current lead,
L is length of the current lead,
k is thermal conductivity of the current lead]
$Q_{g1}$ and $Q_{g2}$ are represented by $$Q_g = \frac{a_0 PA}{4} \frac{\gamma+1}{\gamma-1} \sqrt{\frac{2R}{\pi M}} \frac{T_H - T_L}{\sqrt{T}}$$

[P is a pressure of residual gas,
A is a radiation area,
τ is a thermal expansion coefficient of residual gas,
R is a thermal constant of residual gas,
M is a molecular weight of residual gas]
$a_0$ is represented by $$a_0 = \frac{a_1 a_2}{a_2 + (A_2/A_1)(1 - a_2)a_1}$$

[$A_1$ and $A_2$ are respectively inflow area and outflow area of thermal energy transferred by residual gas,
$a_1$ and $a_2$ are accommodation coefficients of residual gas to $A_1$ and $A_2$].

\* \* \* \* \*